United States Patent
Kondo et al.

(10) Patent No.: US 10,859,747 B2
(45) Date of Patent: Dec. 8, 2020

(54) PHOSPHOR ELEMENT AND ILLUMINATION DEVICE

(71) Applicant: NGK INSULATORS, LTD., Nagoya (JP)

(72) Inventors: Jungo Kondo, Miyoshi (JP); Naotake Okada, Anjo (JP); Shoichiro Yamaguchi, Ichinomiya (JP); Keiichiro Asai, Nagoya (JP); Shuhei Higashihara, Nagoya (JP); Yuichi Iwata, Nagoya (JP); Tetsuya Ejiri, Kasugai (JP); Akira Hamajima, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/440,090

(22) Filed: Jun. 13, 2019

(65) Prior Publication Data

US 2019/0310408 A1      Oct. 10, 2019

Related U.S. Application Data

(63) Continuation of application No. PCT/JP2017/030841, filed on Aug. 29, 2017.

(30) Foreign Application Priority Data

Dec. 19, 2016   (WO) .................. PCT/JP2016/087718

(51) Int. Cl.
*F21V 8/00*        (2006.01)
*G02B 6/12*        (2006.01)
(Continued)

(52) U.S. Cl.
CPC ............. *G02B 6/0003* (2013.01); *G02B 6/12* (2013.01); *H01S 5/005* (2013.01); *G02B 2006/12097* (2013.01); *H01S 5/32341* (2013.01)

(58) Field of Classification Search
None
See application file for complete search history.

(56) References Cited

U.S. PATENT DOCUMENTS

| 5,485,540 | A | * | 1/1996 | Eda | .......................... | G02B 6/12 |
| | | | | | | 385/129 |
| 6,376,272 | B1 | * | 4/2002 | Bond | ....................... | G02B 6/10 |
| | | | | | | 372/45.01 |

(Continued)

FOREIGN PATENT DOCUMENTS

| JP | H08-148703 A1 | 6/1996 |
| JP | 2002-365461 A1 | 12/2002 |

(Continued)

OTHER PUBLICATIONS

International Search Report and Written Opinion (Application No. PCT/JP2017/030841) dated Oct. 24, 2017.

(Continued)

*Primary Examiner* — Vip Patel
(74) *Attorney, Agent, or Firm* — Burr & Brown, PLLC

(57) ABSTRACT

A phosphor element comprises: a support substrate; an optical waveguide for propagating an excitation light through the waveguide, the optical waveguide comprising a phosphor generating a fluorescence, and the optical waveguide comprising an emission side end surface emitting the excitation light and the fluorescence, an opposing end surface opposing the emission side end surface, a bottom surface, a top surface opposing the bottom surface and a pair of side surfaces; a bottom surface side clad layer covering the bottom surface of the optical waveguide; a top surface side clad layer covering the top surface of the optical waveguide; side surface side clad layers covering the side surfaces of the optical waveguide, respectively; a top surface side reflection film covering the top surface side clad layer; side surface side reflection films covering the side surface (Continued)

side clad layers, respectively; and a bottom surface side reflection film provided between the support substrate and the bottom surface side clad layer.

13 Claims, 14 Drawing Sheets
(2 of 14 Drawing Sheet(s) Filed in Color)

(51) Int. Cl.
  *H01S 5/00* (2006.01)
  *H01S 5/323* (2006.01)

(56) References Cited

U.S. PATENT DOCUMENTS

| | | | |
|---|---|---|---|
| 6,456,638 B1 * | 9/2002 | Fukunaga | H01S 5/32341 372/45.01 |
| 6,836,354 B2 | 12/2004 | Kato et al. | |
| 9,316,372 B2 | 4/2016 | Harada | |

FOREIGN PATENT DOCUMENTS

| | | |
|---|---|---|
| JP | 2014-116081 A1 | 6/2014 |
| JP | 2016-154063 A1 | 8/2016 |
| WO | 2014/203488 A1 | 12/2014 |
| WO | 2016/170803 A1 | 10/2016 |
| WO | 2017/119313 A1 | 7/2017 |

OTHER PUBLICATIONS

Extended European Search Report (Application No. 17883644.1) dated Jan. 25, 2019.
English translation of International Preliminary Report on Patentability (Chapter I) (Application No. PCT/JP2017/030841) dated Jul. 4, 2019.

* cited by examiner

PHOSPHOR ELEMENT AND ILLUMINATION DEVICE

TECHNICAL FIELD

The present invention relates to a phosphor element and an illumination device that emits white light.

BACKGROUND ARTS

Recently, intensive study has been undertaken in headlights for a vehicle employing a laser light source, and one thereof is a white light source constructed by combining blue laser or ultraviolet laser and a phosphor. A light density of excitation light can be increased by condensing laser light, and, moreover, a light intensity of the excitation light can also be increased by condensing multiple beams of laser light so as to overlap on the phosphor. As a result, light flux and brightness can simultaneously be increased without changing a light emission area. Therefore, a white light source that combines semiconductor laser and a phosphor with each other is attracting attention as a light source that replaces the LED. For example, as phosphor glass used for the vehicle headlight, phosphor glass "Lumiphous™" from Nippon Electric Glass and YAG monocrystal phosphors from National Institute for Materials Science, Tamura Corporation, and Koha Co., Ltd. are proposed.

According to Patent Document 1, a non-reflection film for excitation light and a total reflection film for fluorescence are formed on an incident surface of an optical waveguide in a flat plate shape. The fluorescence that has been oscillated in the optical waveguide and has returned to the incident surface side can be reflected on the total reflection film on the incident surface, and can be emitted from an emission surface side.

Moreover, reflection films are formed on side surfaces of a flat plate type transmissive phosphor, thereby preventing fluorescent from being emitted from the side surfaces of the flat plate type phosphor according to Patent Document 2.

CITATION LIST

Patent Document

PATENT DOCUMENT 1: WO 2014-203488A1
PATENT DOCUMENT 2: JP 2014-116081A
PATENT DOCUMENT 3: WO 2017/119313A1

SUMMARY OF THE INVENTION

However, there are limits on the light densities of the fluorescence and the excitation light in an element that causes the excitation light to propagate through the phosphor in a flat plate shape, thereby generating fluorescence.

The present applicant has proposed such a configuration as to confine excitation light in phosphor in an optical waveguide shape, cause the excitation light to propagate, and confine generated fluorescence in the optical waveguide in Patent Document 3.

However, as a result of study of these phosphor elements in various ways, it is turned out that the following problems still remain. In other words, if the phosphor is formed into a structure of the optical waveguide type, the excitation light propagates through the waveguide. However, though some part of the fluorescence becomes the waveguide propagation light, other part of the fluorescence does not propagate through the waveguide, is emitted to the outside of the waveguide, and is lost.

This is because the fluorescence converted from the excitation light is not directive, and is emitted in random directions. As a result, as shown in FIG. 12, though fluorescence includes light propagating forward toward an emission side end surface as the waveguide light, light that does not satisfy a total reflection condition of the optical waveguide also exists, exits toward the outside (refer to FIG. 13), cannot be used as white light, and causes a decrease in conversion efficiency.

An object of the present invention is, in a phosphor element of making excitation light incident to an optical waveguide and generating fluorescence, to provide a structure of efficiently obtain the fluorescence from an emission side end surface of the optical waveguide as waveguide transmission light.

The present invention provides a phosphor element comprising:
 a support substrate;
 an optical waveguide for propagating an excitation light through said optical waveguide, said optical waveguide comprising a phosphor generating a fluorescence, and said optical waveguide comprising an emission side end surface emitting said excitation light and said fluorescence, an opposing end surface opposing said emission side end surface, a bottom surface, a top surface opposing said bottom surface and a pair of side surfaces;
 a bottom surface side clad layer covering said bottom surface of said optical waveguide;
 a top surface side clad layer covering said top surface of said optical waveguide;
 side surface side clad layers covering said side surfaces of said optical waveguide, respectively;
 a top surface side reflection film covering said top surface side clad layer;
 side surface side reflection films covering said side surface side clad layers, respectively; and
 a bottom surface side reflection film provided between said support substrate and said bottom surface side clad layer.

The present invention further provides an illumination device, comprising:
 a light source that oscillates excitation light; and
 the phosphor element;
 wherein a white light is radiated from said optical waveguide.

According to the present invention, not only the fluorescence reflected on a boundary to the clad layer out of the fluorescence generated in the optical waveguide can be caused to propagate to the emission side end surface, but also the fluorescence, that cannot satisfy the total reflection condition of the optical waveguide and enters the clad layer, is reflected by the respective reflection films provided on the bottom surface, the top surface, and the respective side surfaces, and enters again into the optical waveguide. The emission light amount of the fluorescence from the emission side end surface can thus be stabilized.

BRIEF DESCRIPTION OF THE DRAWINGS

The patent application file contains at least one drawing executed in color. Copies of this patent or patent application publication with color drawings) will be provided by the Office upon request and payment of the necessary fee.

EMBODIMENTS FOR CARRYING OUT THE INVENTION

Figure 1:
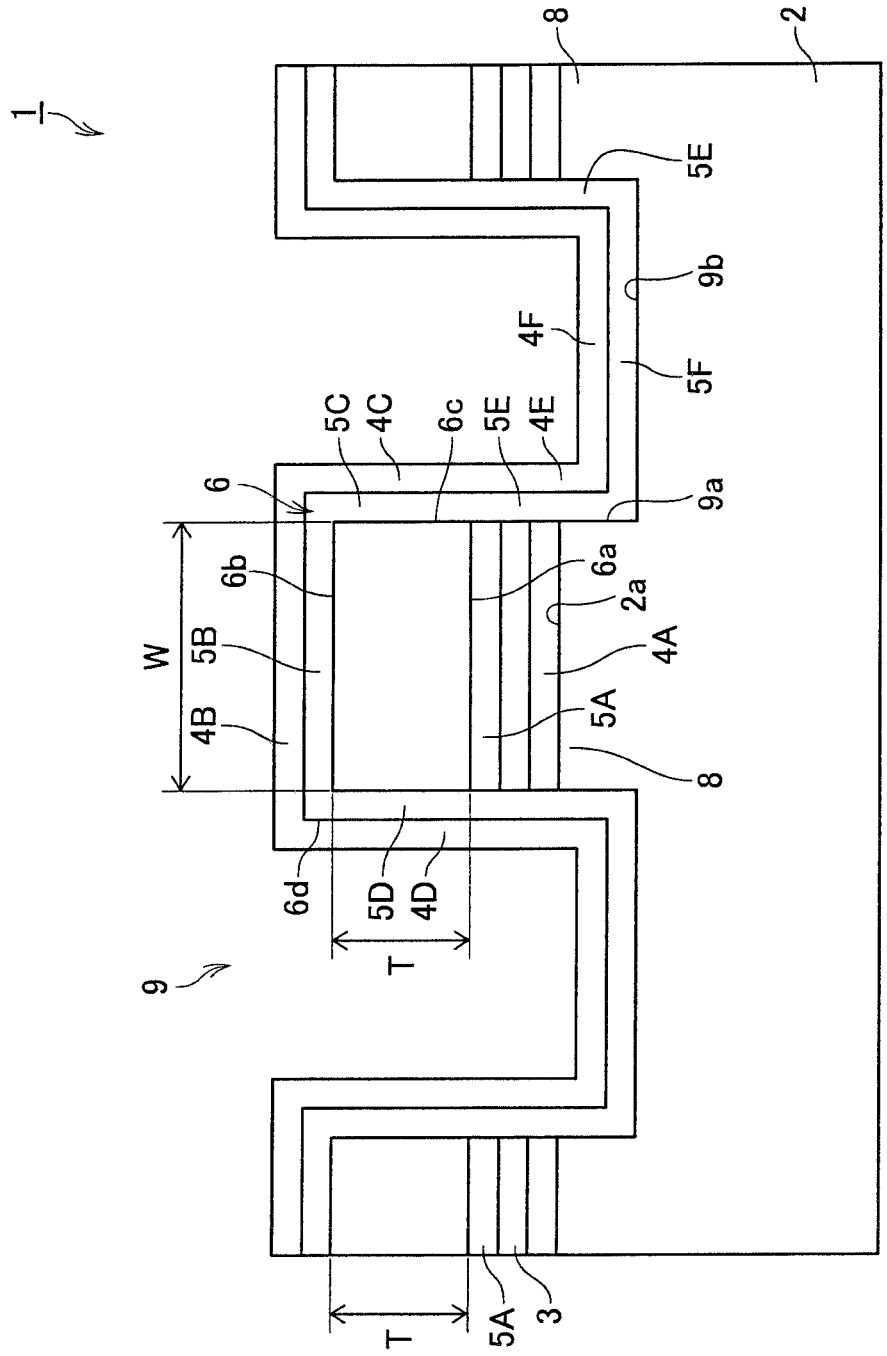
FIG. 1 is a schematic view of a phosphor element 1 according to an embodiment of the present invention.
Figure 2:
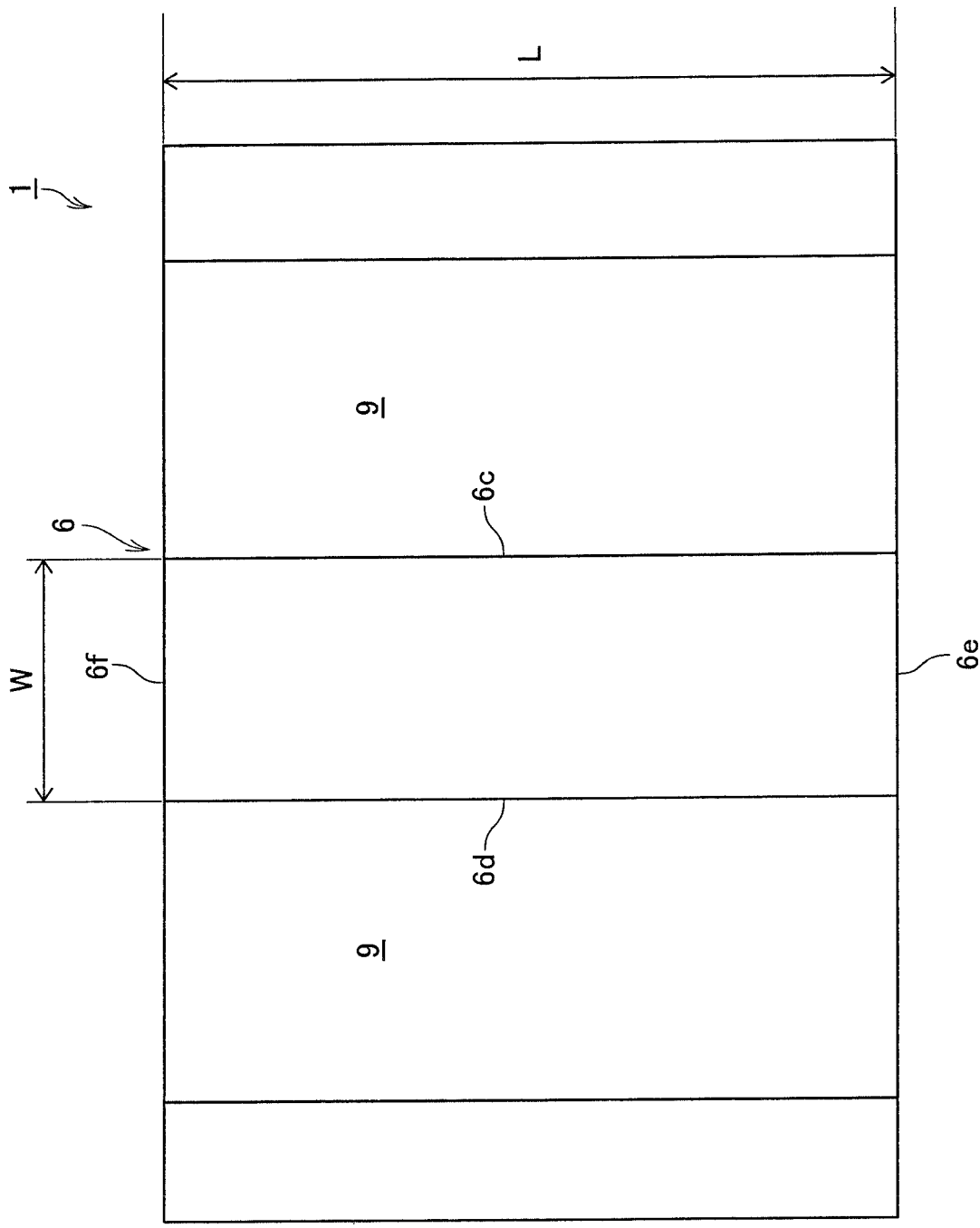
FIG. 2 is a schematic view indicating planar dimensions of the phosphor element 1.
Figure 3:
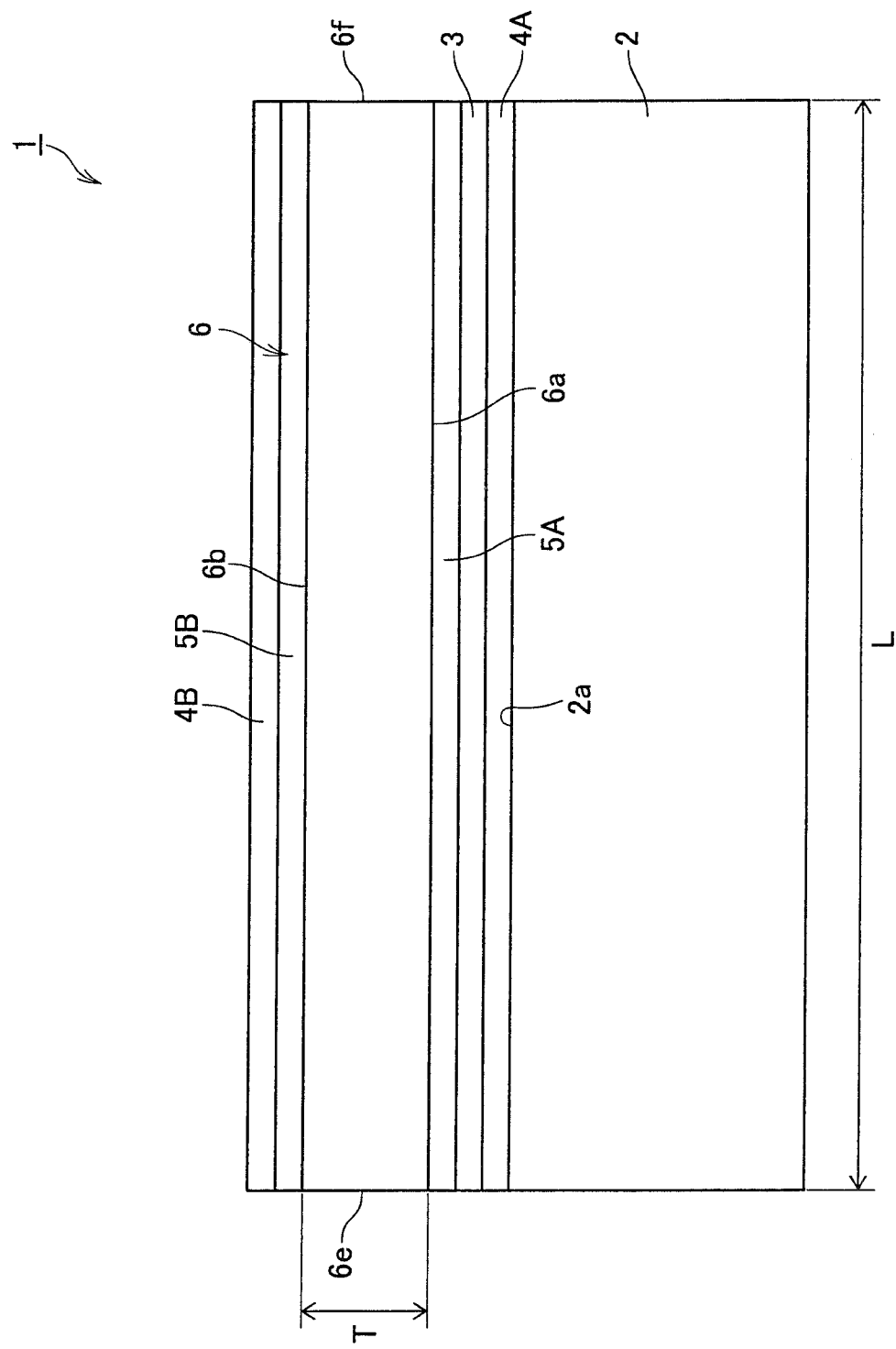
FIG. 3 is a side view of the phosphor element 1.

FIG. 1 to FIG. 3 show a phosphor element 1 according to an embodiment of the present invention.

Multiple protrusions 8 are provided on a support substrate 2 of the phosphor element 1, and a groove 9 is provided between each pair of the protrusions 8. Then, a bottom surface side reflection film 4A, a bonding layer 3, a bottom surface side clad layer 5A, and an optical waveguide 6 formed of an optical material are provided on the protrusion 8.

The bottom surface side clad layer 5A is provided on a bottom surface 6a of the optical waveguide 6, a top surface side clad layer 5B is provided on a top surface 6b, and side surface side clad layers 5C and 5D are provided respectively on the respective side surfaces 6c and 6d. Further, a top surface side reflection film 4B is provided on the top surface side clad layer 5B, and side surface side reflection films 4C and 4D are provided respectively on the respective side surface side clad layers 5C and 5D. A passivation film may be formed in order to prevent the reflection film from being degraded on the top side reflection film 4B. An oxide film may be exemplified as the passivation film.

According to this embodiment, side wall surfaces 9a and a bottom wall surface 9b of the grove 9 are covered respectively with recess side clad layers 5E and 5F, and the recess side clad layers 5E and 5F are covered respectively with recess side reflection films 4E and 4F. The recess side clad layer 5E and the side surface side clad layer 5C continue to one another, and the recess side reflection films 4E and the side surface side reflection films 4C and 4D continue to one another.

In this example, as shown in FIG. 2, the width W of the top surface of the optical waveguide is constant between an emission side end surface 6f and an opposing end surface 6e. Moreover, as shown in FIG. 3, the thickness T of the optical waveguide is constant between the emission side end surface 6f and the opposing end surface 6e. It should be noted that excitation light may be made incident from the opposing end surface or may be made incident from the emission side end surface and may be totally reflected on the opposing end surface.

According to this embodiment, not only fluorescence reflected on boundaries between the optical waveguide 6 and the clad layers 5A to 5D out of fluorescence converted in the optical waveguide 6 can be caused to propagate to the emission side end surface, but fluorescence, that cannot satisfy a total reflection condition of the optical waveguide and enters the clad layers, is also reflected by the respective reflection films provided on the bottom surface, the top surface, and the respective side surfaces, and enters again into the optical waveguide. The emission light amount of the fluorescence from the emission side end surface can be increased.

According to a preferred embodiment, the grooves each including the side wall surfaces and the bottom wall surface are formed on the support substrate, and include the recess side clad layers that cover the side wall surfaces and the bottom wall surface and the recess side reflection films provided on the recess side clad layers, the recess side clad layers and the side surface side clad layers are continuous to one another, and the recess side reflection films and the side surface side reflection films are continuous to one another. The fluorescence made incident at an angle, that does not satisfy the total reflection condition of an interface between the optical waveguide and the clad layer, is usually radiated into the clad layer without being reflected. But it is reflected on the respective reflection films in this case. Thus, the fluorescence can propagate in the phosphor while repeating such a reflection and can reach the emission end surface.

Further, as actions and effects of this embodiment, an improvement in a heat radiation characteristic can be pointed out.

Heat is generated in the phosphor by a conversion loss during the conversion from the excitation light to the fluorescence, an increase in the temperature of the phosphor itself by this heat generation leads to a decrease in conversion efficiency, and a balance between an excitation light amount and a fluorescence amount changes, which causes an uneven color. Moreover, there may be such a case that the fluorescence is absorbed by the reflection films, the reflection films generate heat, the temperature of the phosphor consequently increases, and the optical characteristic changes in the same way.

However, according to this embodiment, there is such a heat conduction path that the heat generated in the phosphor is directly radiated via the bottom surface side clad layer and the reflection film to the support substrate. Further, the heat conducts via the clad layers and the reflection films provided on the top surface and the respective side surfaces toward the recess side clad layers and the recess side reflection films on the support substrate side, and is radiated to the support substrate. The decrease in the conversion efficiency caused by the thermal degradation of the phosphor can be suppressed, and the variation of the uneven color can consequently be suppressed.

In a preferred embodiment, the width of the top surface of the optical waveguide increases from the opposing end surface toward the emission side end surface. As a result, the emission light amount can increase more on the emission side end surface.

Figure 4:
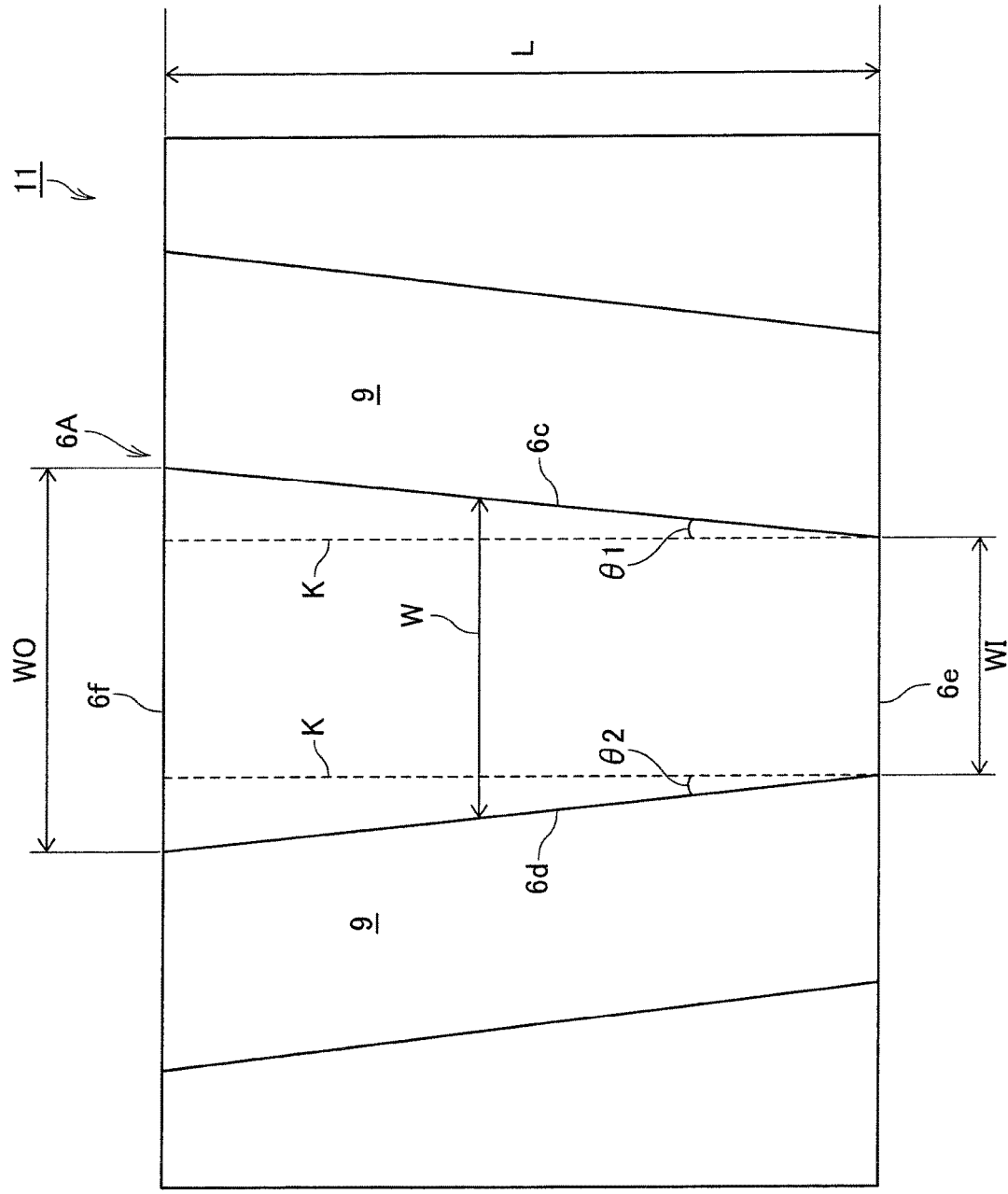
FIG. 4 is a schematic view indicating planar dimensions of a phosphor element 11 according to an embodiment of the present invention.

In other words, the width W of an optical waveguide 6A is WI on the opposing end surface 6e, and is WO on the emission side end surface 6f in a phosphor element 11 in FIG. 4. Then, the width W increases from WI toward WO.

It should be noted that $\theta 1$ is an angle between a lengthwise direction K and the side surface 6c of the optical waveguide, and $\theta 2$ is an angle between the lengthwise direction K and the side surface 6d of the optical waveguide. In this example, the angles $\theta 1$ and $\theta 2$ are constant. $\theta 1$ and $\theta 2$ are preferably constant, but do not need to be constant, and may change between the emission side end surface and the opposing end surface. Preferably, the width W continuously and smoothly increases from the opposing end surface toward the emission side end surface.

Figure 5:
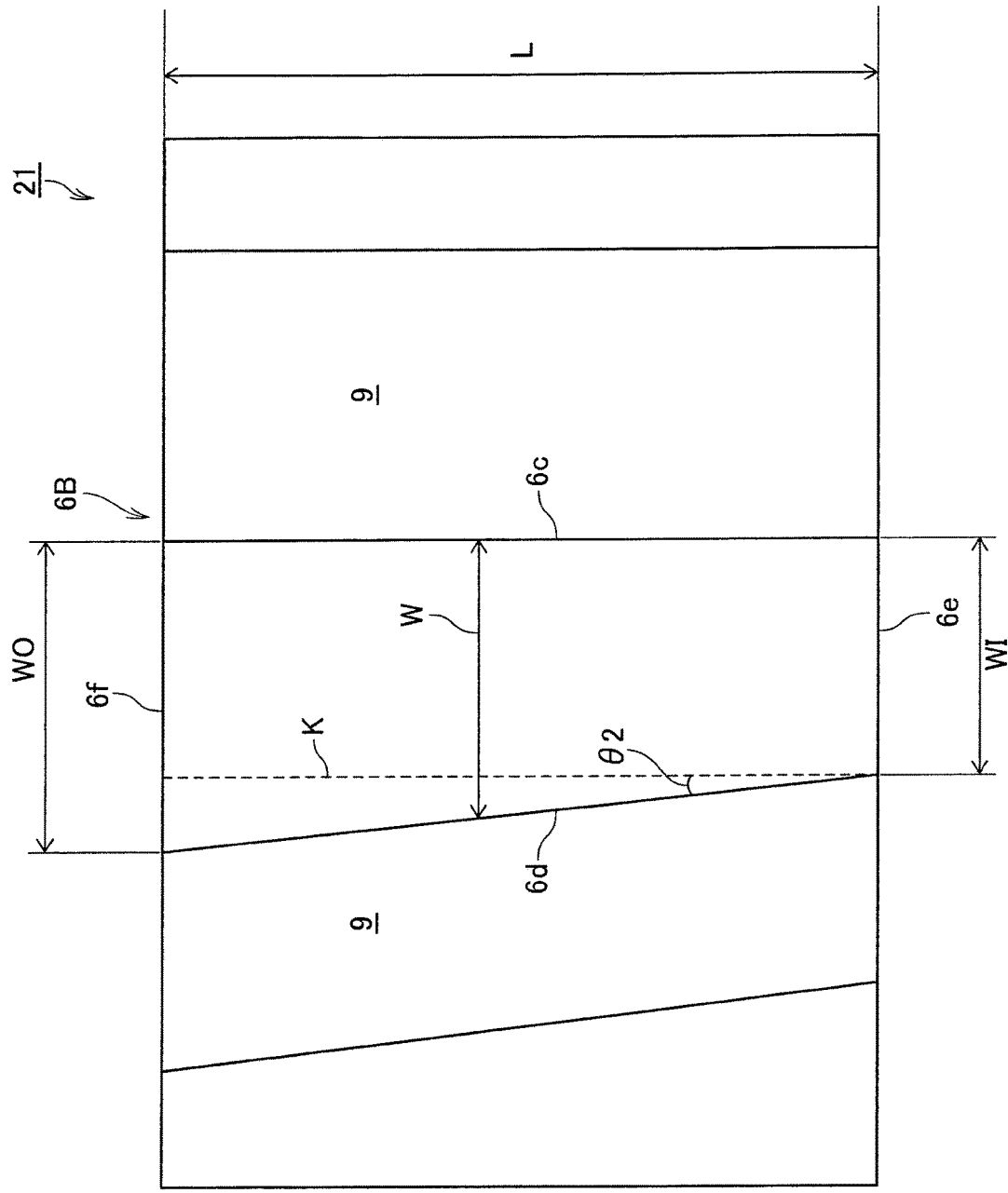
FIG. 5 is a schematic view indicating planar dimensions of a phosphor element 21 according to an embodiment of the present invention.

The width W of an optical waveguide 6B is WI on the opposing end surface 6e, and is WO on the emission side end surface 6f in a phosphor element 21 in FIG. 5. Then, the width W increases from WI toward WO. It should be noted that the angle $\theta 2$ between the lengthwise direction of the optical waveguide and the side surface 6d is constant, and $\theta 1$ is 0°.

Moreover, in a preferred embodiment, the thickness of the optical waveguide increases from the opposing end surface toward the emission side end surface. For example, a thickness T of an optical waveguide 6C is TI on the opposing end surface 6e and is TO on the emission side end surface 6f in a phosphor element 31 in FIG. 6. Then, the thickness T increases from TI toward TO.

It should be noted that $\alpha$ is an angle between the lengthwise direction K and the top surface 6a of the optical waveguide. In this example, the angle $\alpha$ is constant. $\alpha$ is preferably constant, but does not need to be constant, and may change between the emission side end surface and the opposing end surface. Preferably, the thickness T continuously and smoothly increases from the opposing end surface toward the emission side end surface.

A description is further given of an advantage of the changes in the width and the thickness of the optical waveguide.

Figure 7:
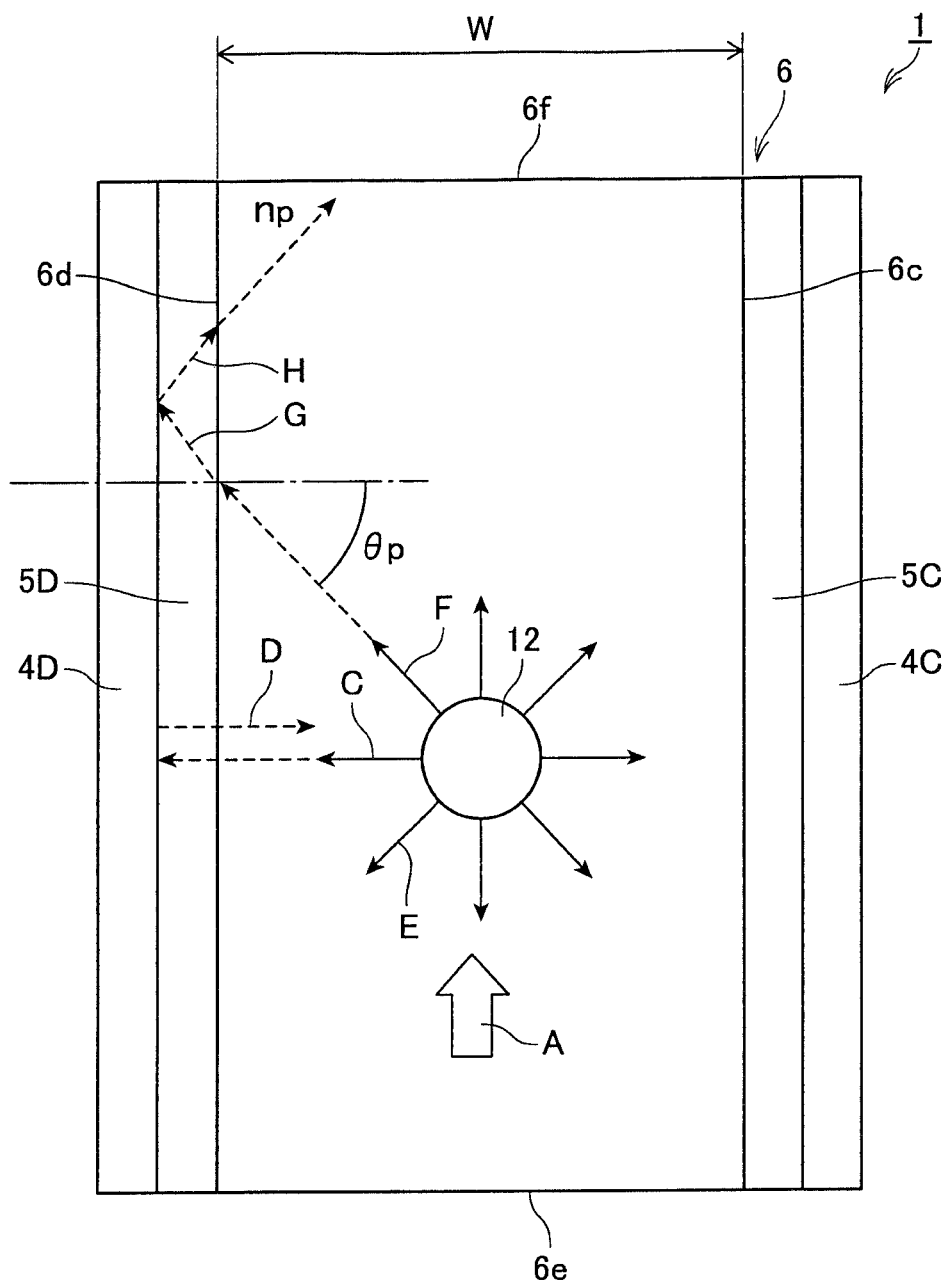
FIG. 7 is a schematic view of a propagation of fluorescence in the phosphor element 1.

In the phosphor element 1 shown in FIG. 7, the width of the optical waveguide 6 is constant. On this occasion, excitation light A propagates in the optical waveguide, and when excitation light A hits a phosphor particle 12, fluorescence is emitted from phosphor particles 12. On this occasion, the fluorescence is emitted evenly in every direction from the phosphor particles. On this occasion, fluorescence F radiated from the phosphor particles 12 to the emission side end surface reaches the interface to the clad layer at an incident angle $\theta p$.

On this occasion, if a refractive index np of the optical waveguide, a refractive index nc of the clad layer, and the incident angle $\theta p$ satisfy the total reflection condition, the fluorescence is reflected on the interface, propagates through the optical waveguide, and is emitted from the emission side end surface 6f. On the other hand, the incident angle $\theta p$ of the fluorescence does not satisfy the total reflection condition, the fluorescence is refracted as indicated by an arrow G, is reflected by the reflection film 4C or 4D, and is reflected as indicated by an arrow H. The light propagating while repeating such a reflection does not propagate in the optical waveguide, but is partially attenuated by absorption by the reflection films and the phosphor, and partially reaches the emission side end surface 6f. However, this light does not have directivity, is radiated from the emission end, constitutes a fluorescence component that cannot be mixed with the excitation light that propagates through the optical waveguide. Thus, the extraction efficiency of the white light cannot be largely improved.

If the clad layers are not provided, and the respective reflection films are directly in contact with the phosphor, both the excitation light and the fluorescence propagate while repeating the reflection on the reflection films without the optical waveguide propagation. A part of the excitation light and the fluorescence is attenuated in the phosphor as described before, both of the excitation light and the fluorescence, that have reached the emission side end surface 6f, are emitted from the end surface without the directivity. It is thus difficult to extract white light in the front surface direction, and the improvement of the extraction efficiency is difficult.

On this occasion, the fluorescence C generated from the phosphor particles 12 in the direction perpendicular to the lengthwise direction of the optical waveguide is reflected on the reflection film as indicated by an arrow D, repeats the reflection in the optical waveguide, and is finally attenuated. Moreover, fluorescence E generated from the phosphor 12 toward the opposing end surface side repeats a reflection similar to that described above, and finally reaches the opposing end surface side. Therefore, a reflection film that reflects the fluorescence is preferably provided on the opposing end surface, thereby reflecting the fluorescence toward the emission side end surface side.

Figure 8:
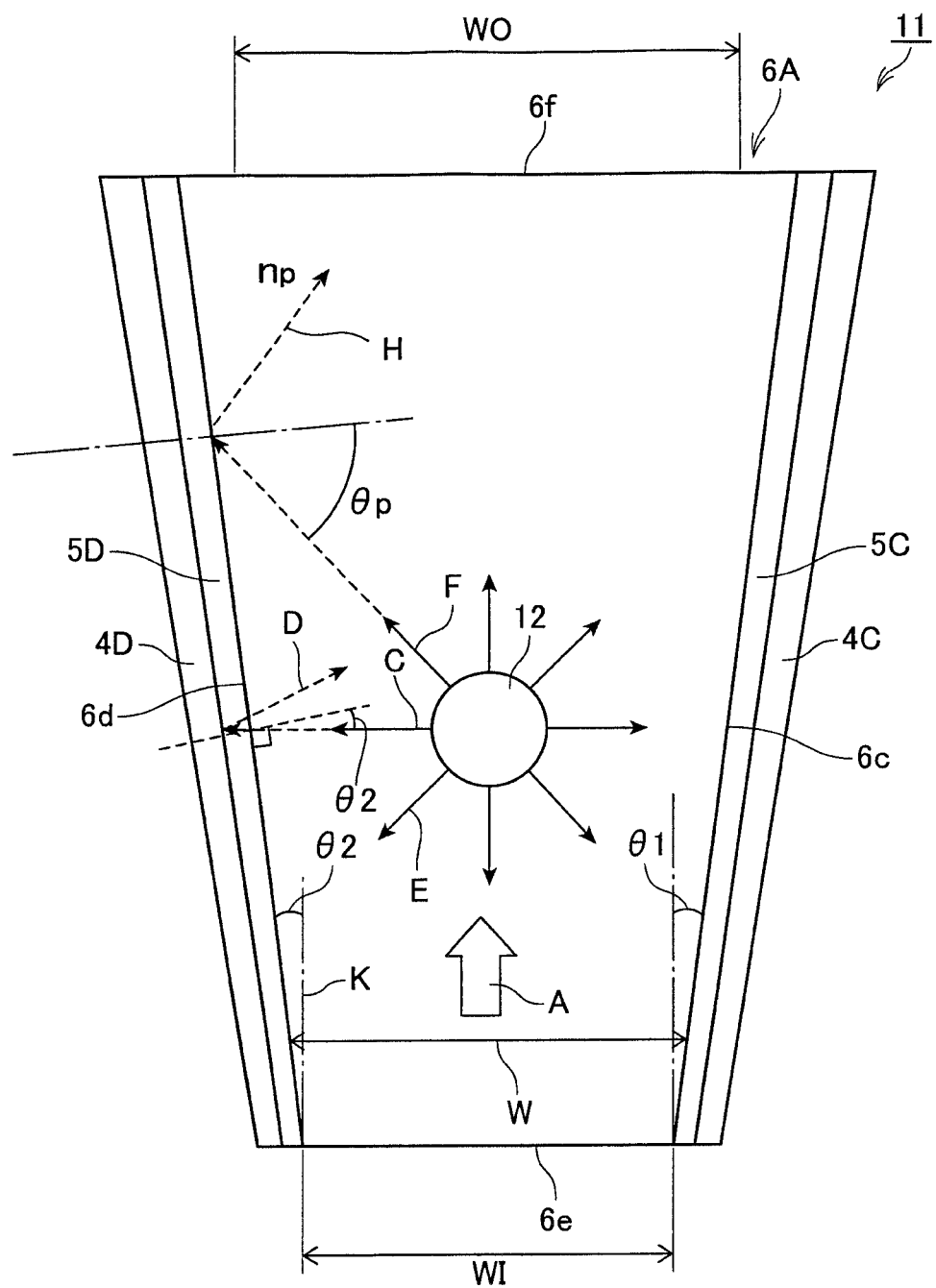
FIG. 8 is a schematic view of the propagation of the fluorescence in the phosphor element 11.

On the other hand, the width W of the optical waveguide 6 gradually increases from the opposing end surface toward the emission side end surface in the phosphor element 11 illustrated in FIG. 8. On this occasion, the excitation light A propagates in the optical waveguide, and when the excitation light A hits the phosphor particle 12, fluorescence is emitted from each of the phosphor particles 12. On this occasion, the fluorescence is emitted evenly in every direction from the phosphor particles. On this occasion, the fluorescence F radiated from the phosphor particles 12 to the emission side end surface reaches the interface to the clad layer at the incident angle $\theta p$. If the refractive index np of the optical wave guide, the refractive index nc of the clad layer and the incident angle $\theta p$ satisfy the total reflection condition, the fluorescence is reflected at the interface, and propagates through the optical waveguide.

For example, when the side surface 6d of the optical waveguide is inclined by $\theta 2$ with respect to the lengthwise direction K, the incident angle $\theta p$ of the fluorescence F increases by $\theta 2$ compared with that of the example in FIG. 7, and the fluorescence F likely totally reflects on the interface to the clad layer. Thus, the fluorescence F, which cannot satisfy the total reflection condition in the example in FIG. 7, is totally reflected on the interface to the clad layer, propagates through the optical waveguide, and is not absorbed by the reflection films. The emission light amount thus increases further.

On the other hand, as a case in which the incident angle $\theta p$ of the fluorescence does not satisfy the total reflection condition, for example, it is assumed that the incident angle to the clad layer of the fluorescence C generated from the phosphor particles 12 in the direction perpendicular to the lengthwise direction K of the optical waveguide is similarly $\theta 2$, but cannot satisfy the total reflection angle on this occasion. In this case, the fluorescence is reflected by the reflection film 4D, but the angle of the next incident to the interface of the side surface 6c on the opposite side to the clad layer 5C further increases by $\theta 1$, the fluorescence comes to be able to satisfy the total reflection condition between the phosphor and the clad layer as such a reflection is repeated, and finally propagates through the optical waveguide. In the case where the fluorescence is made incident to the side surface 6d at the right angle, though the fluorescence is reflected on the reflection film 4D, the angle made incident to the interface of the side surface 6c increases by θ2, the fluorescence travels toward the emission side end surface side, the incident angle θp increases as the reflection is repeated on the reflection film 4C and the reflection film 4D. The fluorescence comes to be able to satisfy the total reflection condition on the interface between the fluorescence and the clad layer, and comes to propagate through the optical waveguide.

From the above, if the width W of the optical waveguide 6 gradually increases from the opposing end surface toward the emission side end surface, the fluorescence travels toward either one of the emission side end surface side and the opposing end surface side, and it is possible to eliminate the fluorescence that repeats the reflection and attenuates in the phosphor.

The fluorescence E traveling from the phosphor particles 12 toward the opposing end surface side changes in the direction by the angle θ2 toward the emission side end surface side each time the fluorescence E is reflected by the reflection film. The propagation direction changes toward the emission side end surface side as the multiple reflections are repeated, and the fluorescence E finally propagates through the optical waveguide, and is emitted from the emission side end surface. The fluorescence, that still reaches the opposing end surface, is reflected by the fluorescence reflection film provided on the opposing end surface, and this light finally propagates through the optical waveguide and can be emitted from the emission side end surface.

Figure 6:
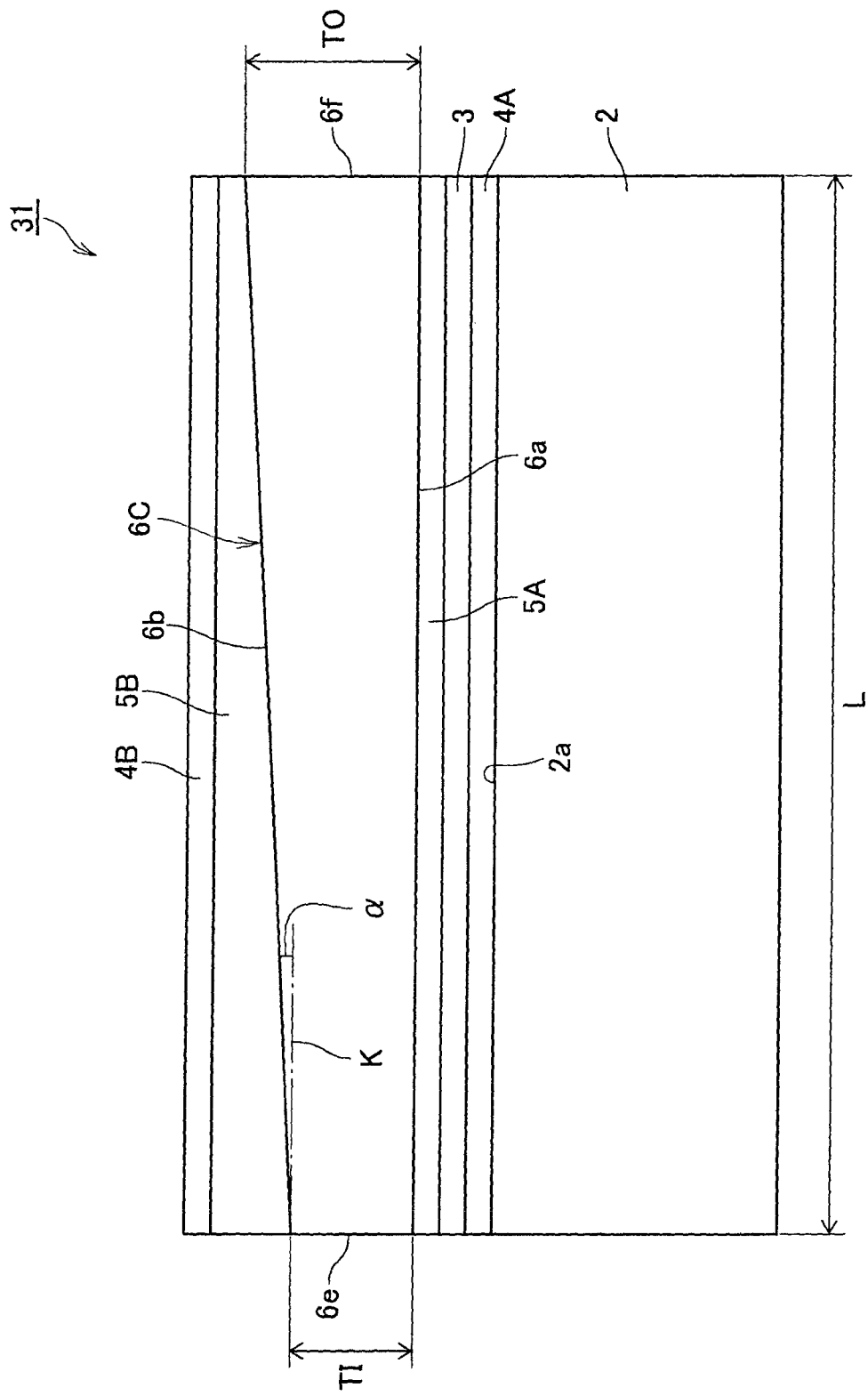
FIG. 6 is a schematic view of a cross section of a phosphor element 31.

On this occasion, though a description has been given of the actions and effects only in the case where the width is changed, the same holds true for a case where a change is made in the thickness direction. The fluorescence reflected toward the top surface side can be emitted from the emission side end surface as the optical waveguide propagation light by the same mechanism also in a case where only a top surface side is inclined by the angle α as shown in FIG. 6.

Moreover, the fluorescence in all the directions generated in the phosphor can be converted to the optical waveguide propagation light, can be highly efficiently emitted to the emission side end surface, and can be mixed with the excitation light that similarly propagates through the optical waveguide, thereby extracting the white light, by providing such a structure as to continuously increase both the width W and the thickness T from the opposing end surface toward the emission side end surface.

Further, the heat generated in the phosphor can be highly efficiently conducted via the reflection films high in the heat conduction to the support substrate high in the heat conduction, and it is possible to realize a phosphor element that does not present a decrease in the conversion efficiency due to thermal degradation, and can thus drastically eliminate a change in the uneven color.

In a preferred embodiment, the width of the optical waveguide changes from the top surface toward the bottom surface. For example, the width of an optical waveguide 6D gradually increases from a width WU at the top surface toward a width WB at the bottom surface in a phosphor element 41 shown in FIG. 9. It should be noted that ß is an inclination angle of the side surface 6c (6d) with respect to a normal line M of a surface 2a of the support substrate 2.

The effect of increasing the light amount of the emitted fluorescence is not expected by the structure of the present embodiment only. It is, however, possible to further increase the light amount of the emitted fluorescence by combining the structure of the present embodiment with the structure in which it is inclined by the inclination angle α with respect to the direction of thickness of the optical waveguide. That is, in the case that the side face is inclined by the inclination angle β, the fluorescence propagating in the direction of width of the optical waveguide is reflected at the side face or a reflection face opposing to the side face and then propagates in the direction of thickness of the optical waveguide. Even in the case that the inclination of an angle θ1 or θ2 is not provided in the direction of the width of the optical waveguide, the propagation in the optical waveguide can be realized by applying the inclination in the thickness direction only, so that the amount of the emitted light can be increased.

Figure 10:
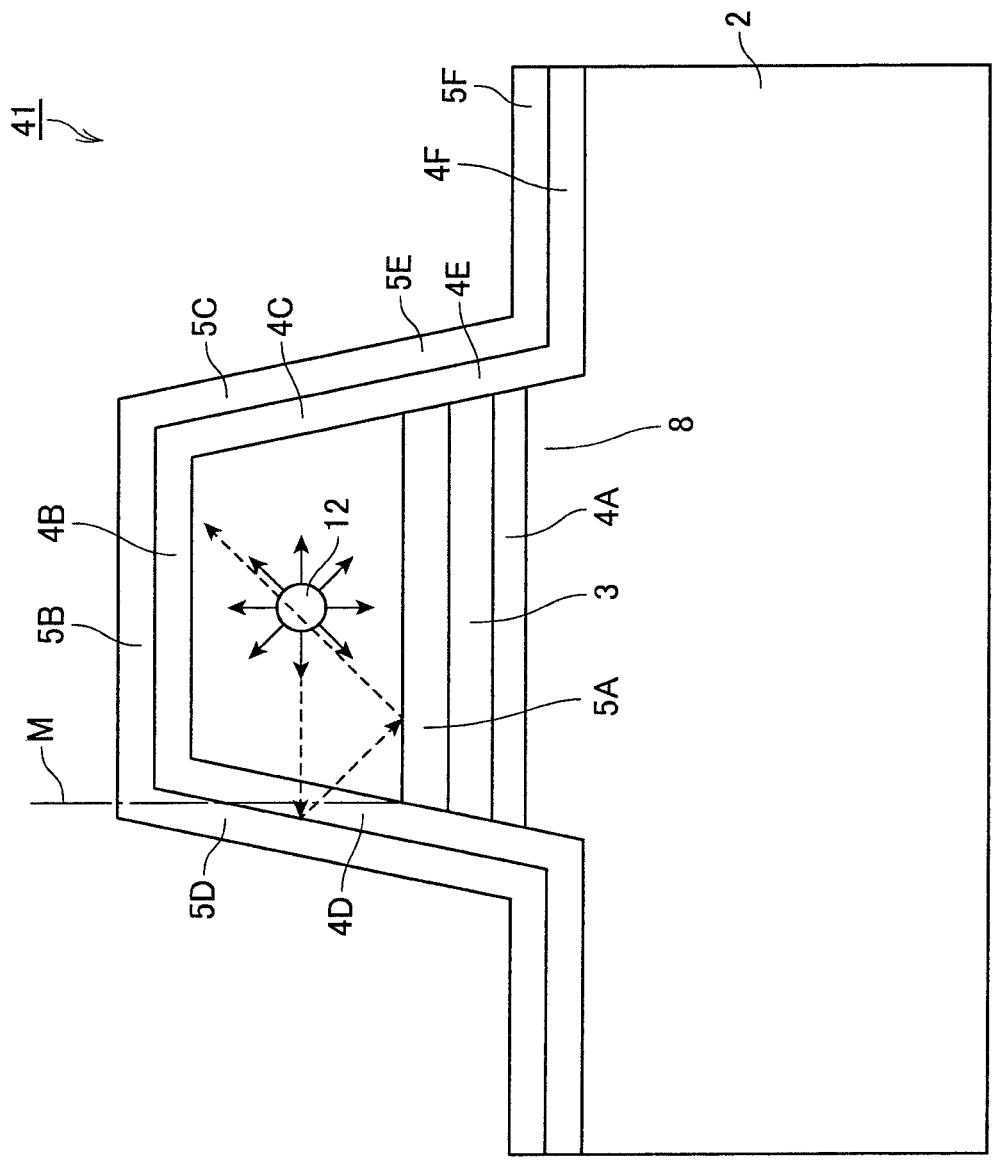
FIG. 10 is a schematic view of a propagation of light in the cross section of the phosphor element 31.

A description is now given of actions and effects of this embodiment with reference to FIG. 10.

Though the fluorescence is emitted from the phosphor particles 12 in all the directions in this example, the light emitted just horizontally out thereof is reflected by the side surface 6c (6d). On this occasion, the side surface 6c (6d) is inclined with respect to the normal line M, and the fluorescence is thus reflected toward the bottom surface, and is further reflected at the bottom surface. The fluorescence is reflected on the top surface, the bottom surface and the side surfaces as the multiple reflections are repeated in this way, and is not repeatedly reflected between the side surfaces. On this occasion, if at least one of the width and the thickness of the optical waveguide is changed between the emission side end surface and the opposing end surface as described before, the emission of the fluorescence toward the emission side end surface is promoted. If the side surfaces are inclined in this way, the fluorescence reflected on the side surface can be changed to light to be reflected on the top and bottom surface sides. By combining this fact with the structure changing in the thickness, all the fluorescence generated in the phosphor can highly efficiently be emitted to the emission side end surface as the optical waveguide propagation light and can be mixed with the excitation light that propagates in the optical waveguide in the same way, thereby highly efficiently extracting the white light.

In the above examples, though the optical waveguide width on the bottom surface is more than the optical waveguide width on the top surface, the optical waveguide width on the bottom surface may be less than the optical waveguide width on the top surface. The optical waveguide may have a triangle shape in which either one of the optical waveguide widths may be zero in this respect. Moreover, though the optical waveguide width is preferably smoothly changed, the optical waveguide width may stepwise be changed.

In a preferred embodiment, a reflection portion that reflects the fluorescence is provided on the opposing end surface. The reflection portion that reflects the fluorescence may reflect the excitation light, or may transmit the excitation light.

The opposing end surface may be an incident surface to which the excitation light is made incident. In this case, a film, that totally reflects the fluorescence and does not reflect the excitation light at all, is preferably formed on the opposing end surface side. Alternatively, the emission side end surface may be an incident surface to which the excitation light is made incident. In this case, a reflection film, that totally reflects the excitation light, may be provided on the opposing end surface side.

The waveguide type phosphor element according to the present invention may be a non-grating type phosphor element that does not include a grating (diffraction grating) in the optical waveguide, or a grating element.

The thickness of the optical waveguide is a dimension of the optical waveguide viewed in a direction perpendicular to the surface 2a of the support substrate 2. Moreover, the width of the optical waveguide is a dimension of the optical waveguide viewed in a direction parallel with the surface 2a of the support substrate 2.

The width W of the optical waveguide is preferably equal to or more than 20 µm, and is preferably equal to or more than 50 µm, from such a viewpoint that the excitation light is efficiently coupled, thereby increasing the emission light amount. On the other hand, the width W is preferably equal to or less than 900 µm, more preferably equal to or less than 500 µm, and most preferably equal to or less than 300 µm, from such a viewpoint as the optical waveguide propagation.

The ratio (WO/WI) of the optical waveguide width WO on the emission side end surface to the optical waveguide width WI on the opposing end surface is preferably equal to or more than 1.2, and is more preferably equal to or more than 1.5 from a viewpoint of the present invention. On the other hand, WO/WI is preferably equal to or less than 10, and is more preferably equal to or less than 5.

The thickness T of the optical waveguide is preferably equal to or more than 20 µm, and is preferably equal to or more than 50 µm, from such a viewpoint that the excitation light is efficiently coupled, thereby increasing the emission light amount. On the other hand, the thickness T of the optical waveguide is preferably equal to or less than 900 µm or less on the viewpoint of present invention, more preferably equal to or less than 200 µm and most preferably equal to or less than 150 µm, from such a viewpoint as a decrease in influence of scatter due to a surface roughness on the side surfaces when an optical waveguide is formed.

The ratio (TO/TI) of the optical waveguide thickness TO on the emission side end surface to the optical waveguide thickness TI on the opposing end surface is preferably equal to or more than 1.1, and is more preferably equal to or more than 1.2, from a viewpoint of the present invention. On the other hand, TO/TI is preferably equal to or less than 2, and is more preferably equal to or less than 1.9.

The angles θ1, θ2 and α of the side surfaces and the top surface with respect to the lengthwise direction of the optical waveguide are preferably equal to or more than 2°, and are more preferably equal to or more than 4°, from such a viewpoint as an increase in the emission light amount.

In the case that the angles θ1, θ2 and α of the side surfaces and the top surface with respect to the lengthwise direction of the optical waveguide is too large, the excited light and fluorescence cannot be mixed well. There is the tendency that, in a plane perpendicular to the direction of propagation of light, illumination pattern is provided in which white light is obtained in the center region and only fluorescence is present in the peripheral region. This is because, as the angles θ1, θ2 and α becomes larger to the extent, the excitation light as the laser light is propagated without expanding in the phosphor. On the other hand, the fluorescence provides isotropic emission and is thus expanded in the phosphor, resulting in the phenomenon described above. On the viewpoint, the angles θ1, θ2 and α are preferably equal to or less than 13°, and are more preferably equal to or less than 10°, and most preferably equal to or less than 5°.

Moreover, the inclination angle β (refer to FIG. 9) of the respective side surfaces of the support substrate with respect to the normal line M of the surface of the support substrate is preferably equal to or more than 10°, and is more preferably equal to or more than 15° from such a viewpoint as the increase in the emission light amount. On the other hand, β is preferably equal to or less than 50°, more preferably equal to or less than 35°, still more preferably equal to or less than 30°, and most preferably equal to or less than 25°.

A length (an interval between the emission side end surface and the opposing end surface) L of the optical waveguide is not particularly limited, but is generally preferably equal to or more than 200 µm for such a reason that the fluorescence needs to be repeatedly reflected until the fluorescence propagates through the optical waveguide, and may be equal to or less than 2 mm in order to decrease a loss accompanying the propagation.

A detachment prevention layer, preferably an oxide film, may be formed between the support substrate and the reflection film in order to prevent the optical waveguide from detaching. A material of such an oxide film is not particularly limited, but is preferably aluminum oxide, tantalum oxide, or titanium oxide. However, the oxide layer is preferably more in the heat conductivity than the phosphor, and the aluminum oxide is most preferable from this viewpoint.

A material of the reflection film may be a metal film such as gold, aluminum, copper, and silver, a mixed crystal film containing these metal components, or a dielectric multilayer film. If the metal film is used as the reflection film, a metal layer of Cr, Ni, or Ti may be formed as a buffer layer for the metal film in order to prevent the clad layer from being detached.

The material of the clad layers may be a material smaller in the refractive index than the phosphor, and the clad layer may serve also as an adhesive layer. The material of the clad layers is preferably $SiO_2$, $Al_2O_3$, $MgF_2$, $CaF_2$, or MgO. Moreover, the clad layers are preferably higher in the heat conductivity than the phosphor in such a viewpoint that the heat generated in the phosphor substrate is radiated through the support substrate, and $Al_2O_3$ and MgO are particularly preferable as such a material.

A bonding layer may be provided between the clad layer and the reflection film. A material of such a bonding layer is not particularly limited, but is preferably aluminum oxide, tantalum oxide, or titanium oxide. However, the bonding layer is preferably more in the heat conductivity than the phosphor, and the aluminum oxide is most preferable from this viewpoint.

Such bonding layer may be provided between the reflection film and supporting body. In this case, it may be produced by the process steps of forming the bottom face side clad layer, bottom face side reflection film and bonding layer on the side of the phosphor, of forming the bonding layer on the side of support substrate and of directly bonding them. Further, the detachment prevention layers may be provided between the reflection film and bonding layer and between the support substrate and bonding layer, respectively.

The phosphor may be phosphor glass, a monocrystal, or a polycrystal. The phosphor glass is constructed by diffusing rare earth ions in glass serving as a base.

As the glass serving as the base, oxide glass containing silica, boron oxide, calcium oxide, lanthanum oxide, barium oxide, zinc oxide, phosphorus oxide, aluminum fluoride, magnesium fluoride, calcium fluoride, strontium fluoride, or barium chloride may be exemplified, and may be YAG (yttrium aluminum garnet).

Though the rare earth ions diffused in the glass are preferably Tb, Eu, Ce, and Nd, the rare earth ions may be La, Pr, Sc, Sm, Er, Tm, Dy, Gd, or Lu.

As the phosphor monocrystal, $Y_3Al_5O_{12}$, $Ba_5Si_{11}Al_7N_{25}$, and $Tb_3Al_5O_{12}$ are preferable. A dopant doped in the phosphor is rare earth ions such as Tb, Eu, Ce, and Nd. The phosphor is preferably a monocrystal from such a viewpoint as suppression of the thermal degradation, but even a polycrystal can decrease the heat resistance at grain boundaries, can increase the transmittance if the polycrystal is a dense body, and can thus function as the optical waveguide.

A specific material of the support substrate is not particularly limited, and may be lithium niobate, lithium tantalate, glass such as quartz glass, and rock crystal. However, a support substrate excellent in a heat radiation property may be used in order to suppress the heat of the light source from conducting to the phosphor, or to suppress wavelength conversion and external heating of the phosphor itself. In this case, alumina, aluminum nitride, silicon carbide, Si, silicon nitride, tungsten, copper tungsten, and magnesium oxide may be exemplified.

A detachment prevention layer, preferably an oxide film, may be formed between the support substrate and the reflection film in order to prevent the optical waveguide from detaching. A material of such an oxide film is not particularly limited, but is preferably aluminum oxide, tantalum oxide, or titanium oxide. However, the oxide layer is preferably more in the heat conductivity than the phosphor, and the aluminum oxide is most preferable from this viewpoint.

A semiconductor laser made of a GaN material high in reliability for exciting the phosphor for illumination is preferable as the light source. Moreover, a light source such as a laser array arranged in a one-dimensional form can be realized. The light source may be a super luminescent diode or a semiconductor optical amplifier (SOA).

Though a method of generating the white light from the semiconductor laser and the phosphor is not particularly limited, but the following methods are conceivable.

A method of generating yellow fluorescence by blue laser and phosphor, thereby acquiring white light.

A method of generating red and green fluorescence by blue laser and phosphor, thereby acquiring white light.

A method of generating red, blue, and green fluorescence from blue laser or ultraviolet laser by phosphor, thereby acquiring white light.

A method of generating blue and yellow fluorescence from blue laser or ultraviolet laser by phosphor, thereby acquiring white light.

Moreover, respective end surfaces of a light source element and the phosphor element may be obliquely cut so as to suppress an end surface reflection. The bonding between the phosphor element and the support substrate may be adhesion fixation or direct bonding. The phosphor element may be formed on the support substrate by a film forming method such as sputtering and CVD.

Figure 14:
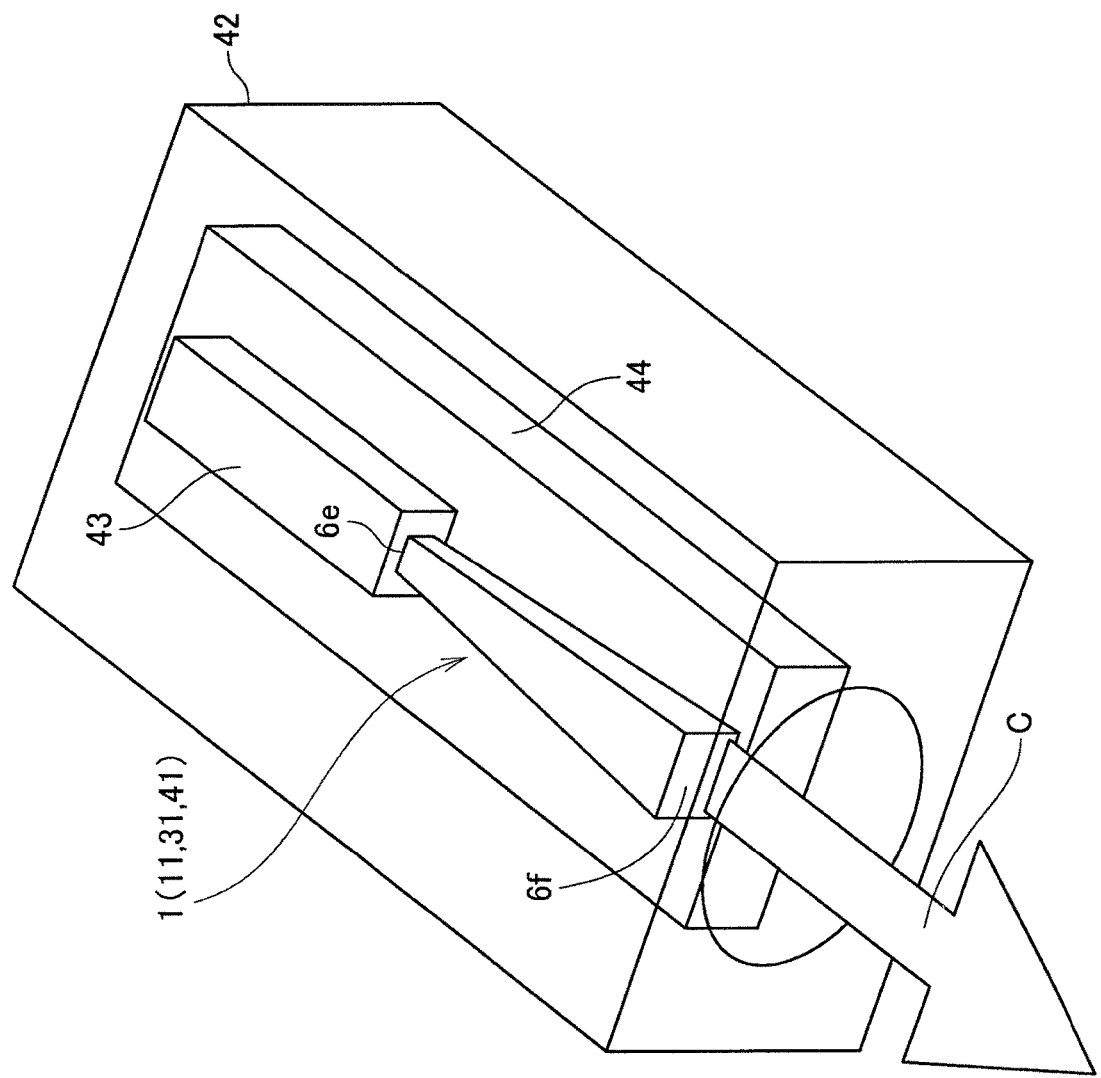
FIG. 14 is a schematic view showing a light emitting system equipped with a light source and a phosphor element.

FIG. 14 shows an example of a structure of a device of emitting white laser light in which the phosphor element of the present invention is applied. According to the structure, a mounting substrate 44 is fixed in a package 42, a laser light source 43 of oscillating excitation light and the phosphor element 1 (11, 31, 41) are positioned straightforwardly on the mounting substrate 44, and the laser light emitted from the light source 43 is made incident into the optical waveguide of the phosphor element directly. The laser device has a device length of, for example, 1.5 mm, so that it can be realized in a size of 5 mm or smaller including the mounting substrate, provided that the device length of the optical waveguide type phosphor element is made 2 mm.

Further, the incident side of the phosphor is made a size and shape including a tolerance for positioning sufficient for the spot shape of the laser light and the mounting, so that the white laser device of a low cost and high efficiency can be realized. It is possible to obtain white laser light C having high directivity of 450 lm or higher in the case that it is applied a laser device of 4W class.

EXAMPLES

Experiment A

Production of Phosphor Element of Example A1

The phosphor element 1 in the form shown in FIG. 1 to FIG. 3 was produced.

Specifically, a detachment prevention film (not shown) made of $Al_2O_3$, was film-formed to 0.2 μm, and a reflection film 4A made of Al was film-formed to 0.5 μm by sputtering on a heat radiation substrate made of aluminum nitride in a form of 4-inch wafer having a thickness of 1 mm. Then, a bonding layer 3 made of $Al_2O_3$ was film-formed to 0.3 μm. Moreover, a clad layer 5A made of $Al_2O_3$ was film-formed to 0.3 μm on a 4-inch phosphor wafer made of polycrystalline YAG (yttrium aluminum garnet) doped with Ce, and having a thickness of 300 μm. Further, both of them were adhered to each other as the $Al_2O_3$ layers by a room temperature direct bonding with an ion gun.

Then, the thickness T of the optical waveguide was polished to a thin plate having a thickness of 100 μm. Grinder grinding and lapping were carried out, and CMP (chemical mechanical polishing) was finally carried out in the thin plate grinding. The two grooves 9 each having a depth of 150 μm were cut by dicing with a blade of #6000 having a width of 200 μm after the CMP, thereby forming a ridge type optical waveguide having the width W of 100 μm.

Further, a clad layer 2 made of $Al_2O_3$ was formed to 0.3 μm, a reflection film made of Al was formed to 0.5 μm, and a protection film (not shown) made of $Al_2O_3$ was formed to 0.2 μm on the ridge-optical-waveguide formed surface.

The composite wafer was cut into a bar form having an optical waveguide length of 1 mm by dicing with a blade of #4000 having a width of 200 μm after the film forming, and a dielectric multilayer that presents no reflection in a 450 nm band of the excitation light and a total reflection in a 560 nm band of the fluorescence was formed on the end surface on the incident side in an IBS (ion-beam sputter coater) film forming device.

Finally, a phosphor element was produced by cutting the bar form into a chip having a width of 0.8 mm with the blade used for the cutting after the film forming.

Production of Phosphor Element of Example A2

The phosphor element 31 shown in FIG. 1, FIG. 2, and FIG. 6 was produced.

Specifically, a polycrystal phosphor board is adhered to a heat radiation substrate made of aluminum nitride as in the example A1 to produce a composite substrate.

Then, a wafer is set on a high-speed slicing device, and is cut into a thin plate with a blade of #6000 a width of which is 1 mm, and a tip of which is in a wedge shape having an inclination angle of 5° in the high-speed slicing device so that the thickness T of the optical wave guide at an incident portion is 100 μm. On this occasion, the inclination angle α is 5° in the thickness direction of the phosphor optical waveguide.

Production of Phosphor Element of Example A3

Figure 9:
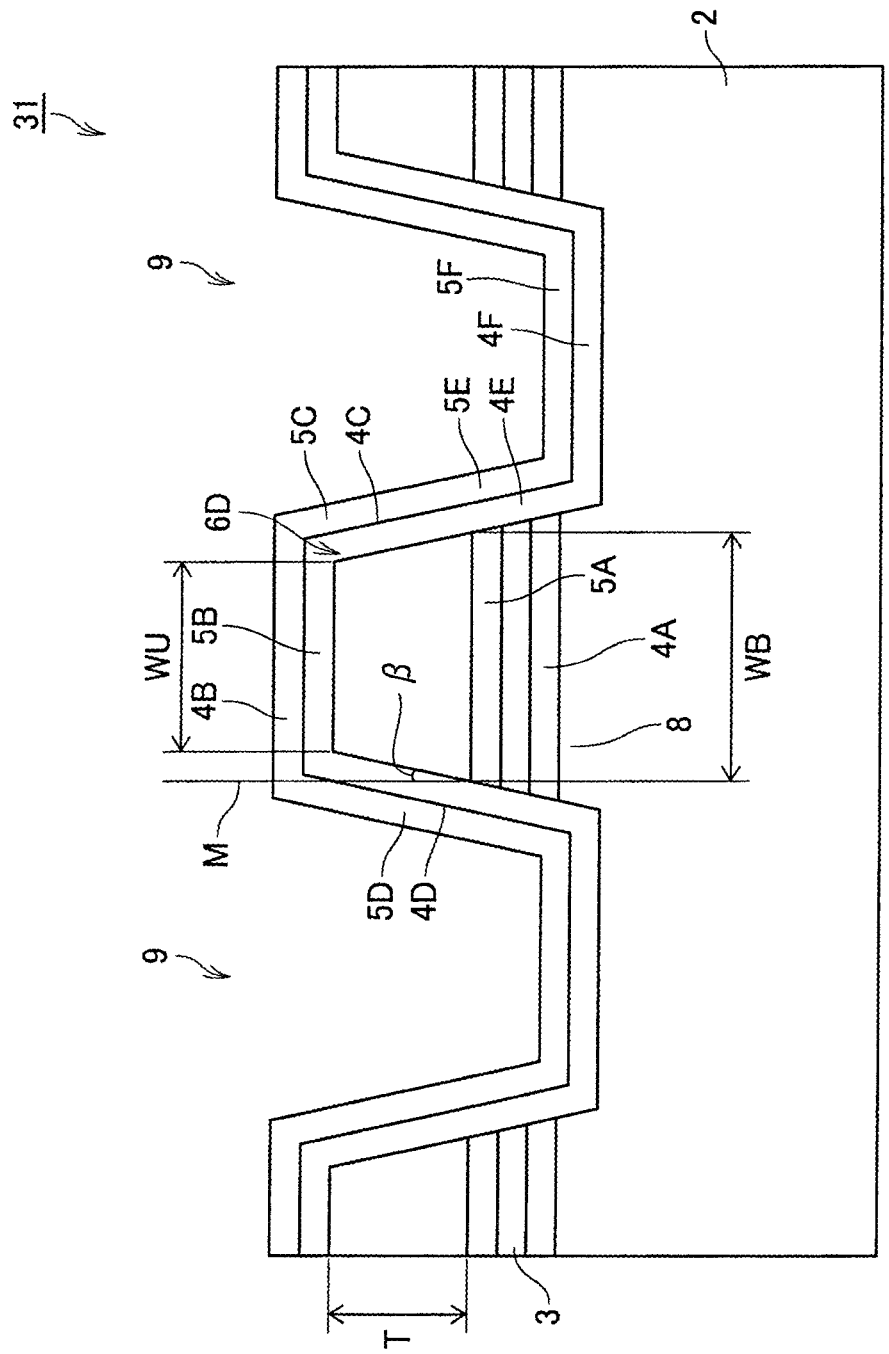
FIG. 9 is a schematic view of a cross section of the phosphor element 31.

The phosphor element 41 shown in FIG. 2, FIG. 3, and FIG. 9 was produced. Specifically, the phosphor element 41 was produced as in the example A2.

It should be noted that a blade was selected so that the width W of the ridge top surface portion was 100 µm, and the inclination angle β was 20°, and the cutting was carried out in the ridge waveguide forming process by the cutting. The other processes were the same as those of the example A2.

After the thin plate machining, the clad layer, the reflection film, and the protection film (not shown) were film-formed, and the bar cutting, the end surface film forming, and the chip cutting were carried out, thereby producing the phosphor element as in the example A1.

Production of Phosphor Element of Comparative Example 1

Figure 11:
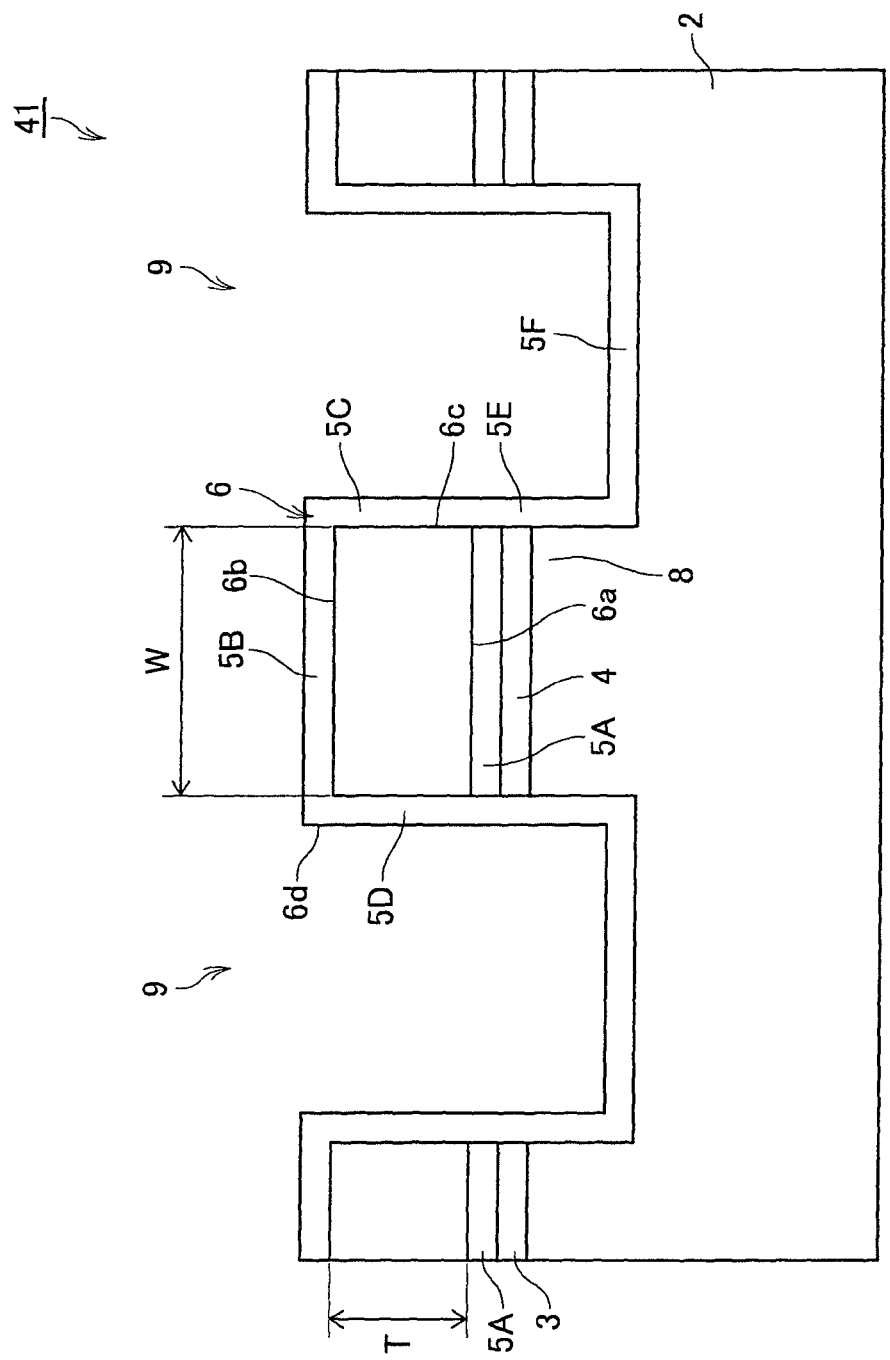
FIG. 11 is a schematic view of a phosphor element 41 according to a control.
Figure 12:
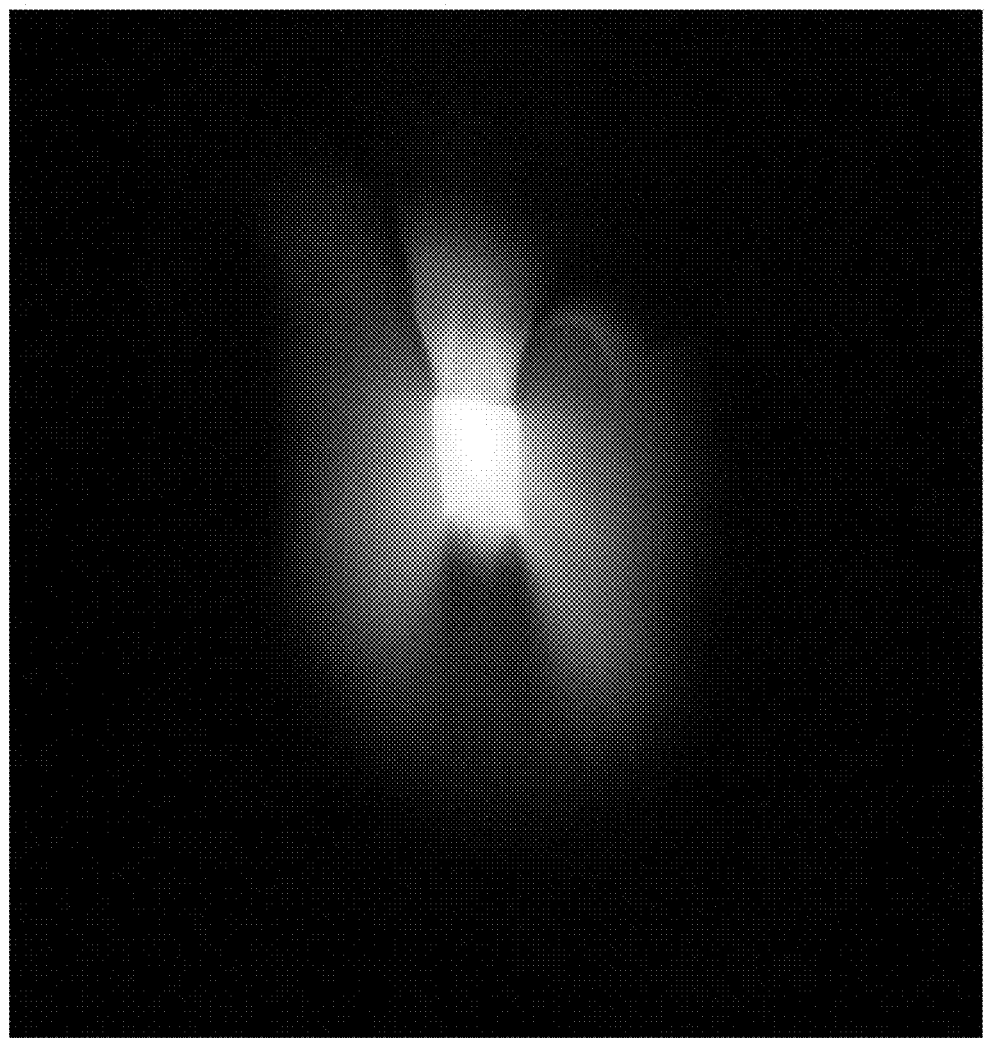
FIG. 12 is an optical photomicrograph of fluorescence emitted from an optical waveguide.
Figure 13:
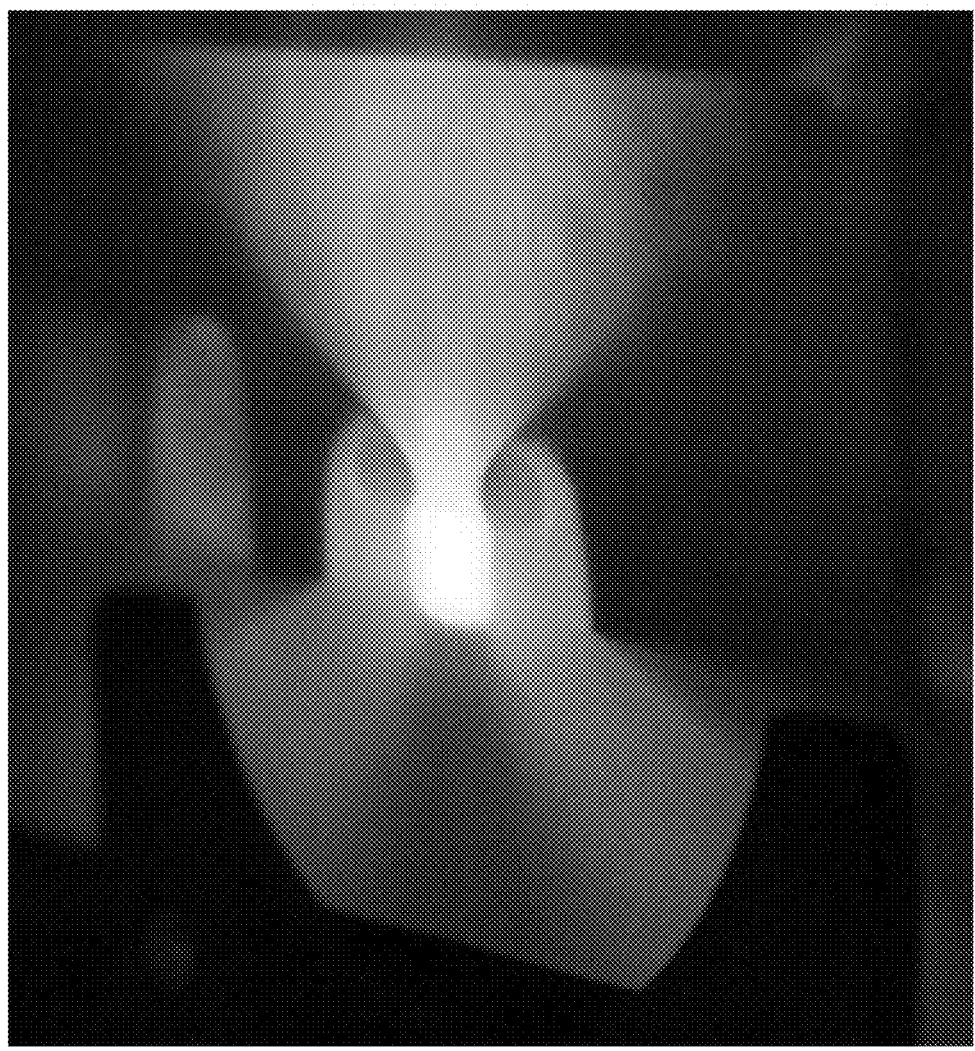
FIG. 13 is an optical photomicrograph of fluorescence emitted from an optical waveguide and leak light.

The phosphor element 41 in the form shown in FIG. 11, FIG. 2, and FIG. 3 was produced as in the example A1.

It should be noted that reflection films were not provided on the side surface sides and the top surface side of the optical waveguide as shown in FIG. 11.

Production of Phosphor Element of Comparative Example 2

A phosphor element in the form shown in FIG. 1, FIG. 2, and FIG. 3 was produced as in the example 1. It should be noted that the clad layers were not provided, and the reflection films were directly formed respectively on the top surface, the bottom surface, and the side surfaces of the optical waveguide in this example.

(Optical Characteristic Evaluation)

The respective elements formed into the chips were evaluated in terms of the illumination light by using a GaN type blue laser light source having an output of 3 W. Evaluation results of the phosphor elements of the respective examples are shown in TAB. 1.

(Average Output)

An average output represents a time average of a total luminous flux. Total luminous flux measurement is carried out by using an integrating sphere (integrating photometer), turning on a light source to be measured and a standard light source with the total luminous flux of which is valued at the same position, and comparing them with each other. The measurement was carried out by using a method prescribed in JIS C7801 in detail.

(Uneven Color Temperature Characteristic)

A 500-cycle test was carried out to evaluate uneven color variation of the illumination light as described below in an environment in which the temperature changes from −40° C. to 80° C. In this test, a semiconductor laser, which is a light source, was maintained in a state without a temperature variation, and only the phosphors were measured under the condition under which the temperature changes.

(Uneven Color Measurement)

Emitted light was evaluated in the chromaticity diagram by using a luminance distribution measurement device. Then, a case where the distribution is in a range of a median x: 0.3447±0.005 and y: 0.3553±0.005 is determined to be a case without the uneven color, and case where the distribution is not in this range is determined to be a case with the uneven color in the chromaticity diagram.

TABLE 1

| | ILLUMINATION LIGHT OUTPUT (1 m) | TEMPERATURE CHARACTERISTIC OF UNEVEN COLOR |
|---|---|---|
| EXAMPLE A1 | 1181 | WITHOUT UNEVEN COLOR |
| EXAMPLE A2 | 1363 | WITHOUT UNEVEN COLOR |
| EXAMPLE A3 | 1545 | WITHOUT UNEVEN COLOR |
| COMPARATIVE EXAMPLE 1 | 1000 | WITH UNEVEN COLOR |
| COMPARATIVE EXAMPLE 2 | 800 | WITH UNEVEN COLOR |

Experiment B

In the phosphor element of the example A2, the thickness of the phosphor and the width of the optical waveguide in the incident portion were fixed and the inclination angles θ1 and θ2 were changed to 0°, 5°, 10°, 13°, 15° or 20°. The color unevenness of each was measured. The results were shown in table 2.

TABLE 2

| θ1, θ2 | α | Output of white light | Color unevenness In-plane distribution |
|---|---|---|---|
| 0° | 5 | 1363 | None |
| 5° | 5 | 1500 | None |
| 10° | 5 | 1550 | None |
| 13° | 5 | 1400 | None |
| 15° | 5 | 1350 | Observed |
| 20° | 5 | 1300 | Observed |
| Unit | ° | 1 m | — |

Output value "white light"

As a result, it was proved that the color unevenness was generated in the case that the inclination angle was 15° or larger. As the illumination pattern was observed, white light without color unevenness was observed in the central portion and only fluorescence was observed in the peripheral portion. As the inclination angle was made larger, the phenomenon became more considerable. Such result was defined as "In-plane distribution of color unevenness was observed".

Experiment C

The inclination angle α in the direction of thickness was changed at 0°, 5°, 10°, 13°, 15° or 20° as the experiment B. Further in this case, the in-plane distribution of color unevenness was observed at the same angles as those in the experiment B.

As to the structure of the phosphor element, it may be applied the structures other than those described in the examples described above.

For example, it may be used the structure obtained as follows. That is, the detachment prevention film of $Al_2O_3$ and bonding layer of $Ta_2O_5$ were formed by sputtering on a mounting substrate made of aluminum nitride having a thickness of 1 mm and 4 inches, the clad layer of $Al_2O_3$, reflection film of Al, detachment preventing film of $Al_2O_3$ and bonding layer of $Ta_2O_5$ are formed on a polycrystalline phosphor wafer, and both were bonded with each other by direct bonding process at ambient temperature using an ion gun at the $Ta_2O_5$ layers.

(Experiment D)

It was produced the element in which the inclination angles β shown in FIG. 9 were changed, in the example A2.

However, in the step of forming the ridge type optical waveguide by cutting, the width W of the upper surface of the ridge was made 100 μm, and the blade was selected to perform the cutting process so that the inclination angles β were changed at 0° to 60°. The other process steps were made same as those in the example A2.

TABLE 3

| β | α | Output of white light | Color unevenness In-plane distribution |
|---|---|---|---|
| 10° | 5 | 1400 | None |
| 15° | 5 | 1500 | None |
| 20° | 5 | 1545 | None |
| 25° | 5 | 1500 | None |
| 30° | 5 | 1400 | None |
| 35° | 5 | 1350 | None |
| 50° | 5 | 1300 | None |
| 60° | 5 | 1050 | Observed |
| Unit | ° | 1 m | — |

Output value "white light"

As a result, the color unevenness was not generated and the intensity of the white light was particularly increased, in the case that the inclination angle β was 10° or larger and 50° or smaller. As the illumination pattern was observed in the case that β is 60°, white light without color unevenness was observed in the central portion and only fluorescence was observed in the peripheral portion. As the inclination angle was made larger, the phenomenon tends to be observed. Such result was defined as "In-plane distribution of color unevenness was observed".

The invention claimed is:

1. A phosphor element comprising:
   a support substrate;
   an optical waveguide for propagating an excitation light through said optical waveguide, said optical waveguide comprising a phosphor generating a fluorescence, and said optical waveguide comprising an emission side end surface emitting said excitation light and said fluorescence, an opposing end surface opposing said emission side end surface, a bottom surface, a top surface opposing said bottom surface and a pair of side surfaces;
   a bottom surface side clad layer covering said bottom surface of said optical waveguide;
   a top surface side clad layer covering said top surface of said optical waveguide;
   side surface side clad layers covering said side surfaces of said optical waveguide, respectively;
   a top surface side reflection film covering said top surface side clad layer;
   side surface side reflection films covering said side surface side clad layers, respectively; and
   a bottom surface side reflection film provided between said support substrate and said bottom surface side clad layer.

2. The element of claim 1, further comprising:
   a groove comprising side wall surfaces and a bottom wall surface, said groove formed on said support substrate;
   a recessed portion side clad layer covering said side wall surfaces and said bottom wall surface; and
   a recessed portion side reflection film provided on said recessed portion side clad layer;
   wherein said recessed portion side clad layer and said side surface side clad layers are continuous to one another; and
   wherein said recessed portion side reflection film and said side surface side reflection films are continuous to one another.

3. The element of claim 1, wherein a width of said top surface of said optical waveguide increases from said opposing end surface toward said emission side end surface.

4. The element of claim 3, wherein an inclination angle of at least one of said pair of said side faces with respect to a lengthwise direction of said optical waveguide is 2° or larger and 13° or smaller.

5. The element of claim 1, wherein a thickness of said optical waveguide increases from said opposing end surface toward said emission side end surface.

6. The element of claim 5, wherein an inclination angle of said top surface or said bottom face with respect to a lengthwise direction of said optical waveguide is 2° or larger and 13° or smaller.

7. The element of claim 1, wherein a width of said optical waveguide changes from said top surface toward said bottom surface.

8. The element of claim 7, wherein an inclination angle of at least one of said side faces with respect to a normal line of said bottom face is 10° or larger and 50° or smaller.

9. The element of claim 1, wherein a reflection portion reflecting said fluorescence is provided on said opposing end surface.

10. The element of claim 1, wherein said opposing end surface comprises an incident surface to which said excitation light is made incident.

11. The element of claim 1, wherein said emission side end surface comprises an incident surface to which said excitation light is made incident.

12. The element of claim 1, comprising a detachment prevention layer provided between said support substrate and said bottom surface side reflection film.

13. An illumination device, comprising:
   a light source oscillating an excitation light; and
   a phosphor element comprising the phosphor element of claim 1;
   wherein a white light is radiated from said optical waveguide.

* * * * *